(12) United States Patent
Usenko

(10) Patent No.: US 12,009,252 B2
(45) Date of Patent: Jun. 11, 2024

(54) METHOD OF MAKING A SILICON ON INSULATOR WAFER

(71) Applicant: Alexander Yuri Usenko, Belton, MO (US)

(72) Inventor: Alexander Yuri Usenko, Belton, MO (US)

( * ) Notice: Subject to any disclaimer, the term of this patent is extended or adjusted under 35 U.S.C. 154(b) by 0 days.

(21) Appl. No.: 17/222,554

(22) Filed: Apr. 5, 2021

(65) Prior Publication Data

US 2022/0319912 A1 Oct. 6, 2022

(51) Int. Cl.
*H01L 21/762* (2006.01)

(52) U.S. Cl.
CPC ............... *H01L 21/76256* (2013.01)

(58) Field of Classification Search
CPC ........... H01L 27/1203; H01L 21/76251; H01L 21/763; H01L 21/76254; H01L 21/76256; H01L 21/76259; H01L 21/02667; H01L 21/02672; H01L 21/26506
See application file for complete search history.

(56) References Cited

U.S. PATENT DOCUMENTS

| | | | |
|---|---|---|---|
| 2007/0210307 A1* | 9/2007 | Hebras | H01L 21/76254 257/75 |
| 2019/0088466 A1* | 3/2019 | Usenko | H01L 21/02387 |

OTHER PUBLICATIONS

Cynthia A. Desmond et al, The Effects of Process-Induced Defects on the Chemical Selectivity of Highly Doped Boron Etch Stops in Silicon, 1994, J. Electrochem. Soc., 141 178.*

* cited by examiner

*Primary Examiner* — Latanya N Crawford Eason

(57) ABSTRACT

A process for making silicon on insulator wafer by bond and etch back—BESOI. A boron etch stop is formed by BF2+ ion implantation followed by solid phase epitaxy—SPE. Fluorine getters metals for OISF immunity of the final wafer. SPE activates boron above solubility limit thus facilitates high etch selectivity. Future cap silicon film is epitaxially grown over the boron etch stop at temperature that limits boron diffusion and boron deactivation. High temperature hydrogen bake step in epitaxy is replaced with Siconi of similar low temperature process. Buried oxide is thermally grown from portion of cap silicon layer at temperature limiting Boron diffusion and deactivation. Thus, SOI wafer design is the same as in layer transfer process—bonding interface is at the bottom interface of BOX; properties of final SOI wafer are equal to SOI made by layer transfer process—including cap silicon layer thickness variation, and OISF defect count. Advantage over the layer transfer—this process does not require non-standard equipment. Standard processing tool set readily available at semiconductor foundries is sufficient to run this process. Foundries can use this process for in house SOI wafer manufacturing.

11 Claims, 11 Drawing Sheets

Si cap 120nm

<50 nm B diffused from p++

P++

Starting P+/p- epi wafer

METHOD OF MAKING A SILICON ON INSULATOR WAFER

REFERENCE TO RELATED APPLICATIONS

This application claims an invention which was disclosed in Provisional Application No. 63/008,795, filed Apr. 12, 2020, entitled "Method of Making Silicon-on-insulator Wafer". The benefit under 35 USC § 119(e) of the United States provisional application is hereby claimed, and the aforementioned application is hereby incorporated herein by reference.

BACKGROUND OF THE INVENTION

Field of the Invention

The invention relates to methods of making silicon on insulator wafers that can be further used for making chips, which can be further used in various electronics as smartphones or computers.

Description of Related Art

Semiconductor technology is making integrated circuits, also called chips. Mainstream is making them on bulk silicon substrates called wafers. The chip consists of an array of transistors or other semiconductor devices. Each transistor must be electrically insulated from neighboring devices in the semiconductor body. Either bulk silicon wafers or silicon on insulator—SOI—wafers can be used as a starting material in the chip production. For SOI, insulation of individual transistors from each other is simpler compared to bulk Si: transistor bottoms are already insulated, so only sides must be insulated. Eventually the chip manufacturing from SOI wafer is simpler and final chip have better performance compared to the bulk-made chips and can have more functions. For example, the chips on SOI can contain both analog and digital circuitry, thus, say, a front-end chips of cell phones are now made from SOI wafer.

SOI wafers can be made various ways. Initially, in 1960s it was silicon-on-sapphire—SOS—technology. Later other methods were developed—SIPOS, ZMR, SIMOX, BESOI, Eltran, Smart-Cut, etc., see Colinge, J-P. Silicon-on-insulator technology: materials to VLSI. Springer, 2004. Currently, only layer transfer (Smart-Cut) process is used to make mainstream chips. BESOI (Bond-and-Etch-back SOI) process is used for thick SOI—in niche applications as MEMS. All other processes are abandoned now as being inferior to the layer transfer process.

BESOI wafers are currently manufactured in high volume using single etch stop technology, see Tilli, Markku, Mervi Paulasto-Krockel, Teruaki Motooka, and Veikko Lindroos, eds. Handbook of silicon-based MEMS materials and technologies. William Andrew, 2015. The one-etch-stop process limits manufacturing to thick SOI only. Thick is SOI with cap silicon layer about 1 micron or thicker. These are SOI for MEMS chips—microphones in cell phones, acceleration sensors for vehicle airbags, jet printer heads, etc. These are mostly discrete devices. Currently no thin BESOI process in commercial use.

The BESOI process was initially developed by IBM in mid 1980s.—J. Lasky, Wafer bonding for silicon on insulator technologies, Appl. Phys. Lett. 48 (1986) 78. Later this process has been abandoned by IBM, and by the rest of industry. The major problem is high defect density in the top silicon film. It is an OISF type defect—oxidation induced stacking fault—Maszara, W. P., P. P. Pronko, and A. W. McCormick. "Epi-less bond-and-etch-back silicon-on-insulator by MeV ion implantation." Applied Physics Letters 58, no. 24 (1991): 2779-2781.

The OISF defects are formed when there are nucleation centers and a flux of interstitials. A typical nucleation center is a metal contamination in Si. Oxidation of silicon generate interstitials at growing Si—SiO2 interface. During oxidation incoming interstitials sequentially attach to the nucleation center and form OISF rings. The rings might have up to micron size. The bigger defect size is, the higher probability that it will become a killer defect. OISF is usually a killer. The OISF during CMOS chipmaking process causes GOI—gate oxide integrity failure. Thus, the final chip fails.

BESOI process inevitably includes BEOL (back of the line) steps. For example, it includes grinding of device wafer. BEOL is heavily metal contaminating. Say, during the grinding, iron, nickel and other contaminants from grinding wheels diffuse through the device wafer toward Si-BOX interface. They become nucleation centers for the OISF. High OISF count in BESOI wafers causes low yield for chips made from these wafers. This was the major reason why semiconductor industry abandoned BESOI process in early 1990s.

Layer transfer (Smart-Cut) process uses FEOL (front of the line) processing steps only. FEOL is essentially metal free. Therefore, there is no starting point for the OISF grow, and the final SOI wafers are OISF free.

Another difference between BESOI and Smart-Cut wafers is location of the wafer bonding interface. In BESOI the interface is at top side of the BOX, while in Smart-Cut it is at bottom of the BOX. Bonding interface has many types of defects, structural and electrically active ones. In BESOI the bonding interface is closer to transistors, therefore it often causes yield drop. Art would benefit from BESOI process resulting in bonding interface at bottom of BOX side, thus having low defect density at the more important top Si-BOX interface, like in Smart-Cut.

Still, the layer transfer process of making SOI has disadvantages. For example, it needs special equipment and non-standard equipment. The special tool required is a high dose hydrogen and helium ion implanter. The non-standard (not commercially available) is the wafer cleave tool (after implant and bond). Art would benefit from a method of making thin SOI wafers that requires only standard equipment readily available at semiconductor foundries. Thus foundries will be able to manufacture SOI wafers in-house.

SUMMARY OF THE INVENTION

New process flow is used for growing a layer stack on the device wafer:
  ion implantation of BF2+ species into p– epi laying on p+ starting substrate,
  anneal at 450-580 C after the implant step,
  surface preparation for epitaxy using low temperature process,
  epitaxy of silicon layer at temperature below 800 C,
  thermal oxidation at temperature below 800 C
  anneal at 350-750 C after removal of p– layer, before removal of boron etch stop layer
  finalizing of wafer bonding by anneal.
The BF2 implantation is for
  amorphize buried layer in Si—to facilitate further boron activation with SPE
  dope with boron—to form $2^{nd}$ etch stop dope with fluorine—to provide metal getter thus further suppress OISF defects dope with fluorine—to lower interface state density at BOX—Si interfaces The post implant 450-580 C anneal is for epitaxially regrow previously amorphized layer—to enable next epitaxy of cap silicon to electrically activate the implanted boron, thus enable further selective etching minimize boron out diffusion from implanted peak, thus enable high selectivity etch lower fluorine losses—to keep fluorine capacity further serving as metal getter.

The surface preparation for epitaxy is for removal of native oxide—same function as hydrogen bake, but at low temperature—thus no autodoping of cap Si by Boron diffusion from implanted layer performed in Siconi chamber of Centura tool, or similar function Previum chambers in Intrepid/Epsilon tools The epitaxy step is for grow a silicon layer that will ultimately become a cap silicon layer in final SOI wafer use low temperature<800 C—to keep low enough boron autodoping from the etch stop layer The thermal oxidation step is for grow a dielectric layer that will ultimately become a BOX in final SOI wafer enable wafer design with wafer bonding interface at bottom interface of BOX; this eventually provide better GOI and better electrical performance of chips made on the SOI use low temperature<800 C—to keep boron autodoping from etch stop layer low anneal at 350-750 C before removal of boron etch stop layer is for getter metals from cap silicon by layer with heavy B and F content—thus for eventual OISF suppression.

The bond finalizing step is for achieve mechanical property of the bonding interface equal to bulk SiO2 achieve good electrical properties of the interface, i.e., low interface states density.

Summarizing—BESOI process includes preparation of device and handle wafers, bonding them and thinning the device wafer. The device wafer making includes new steps:

(a) Simultaneously amorphize, dope, and modify silicon layer (b) Simultaneously epitaxially regrow previously amorphized layer and activate dopant (c) Low temperature bake off native oxide to enable epitaxy of future cap Si layer while excluding autodoping of the cap Si with Boron from etch stop layer.

Novelty—Si:B:F layer is used for BESOI fabrication for the first time:

(a) use of Si:B:F layer as $2^{nd}$ etch stop, (b) Si:B:F is made by ion implantation followed by solid phase epitaxy (SPE), (c) at cap Si epi step, H bake is replaced with low temperature process (d) after bonding, grinding, and $1^{st}$ etch stop removal steps, before Si:B:F layer etch, a metal gettering anneal is performed, (e) BOX is grown on device stack, not on handle stack.

BESOI processes known in the art use either SiGe or Si:B as $2^{nd}$ etch stops, see review—Maszara, W. P. "Silicon-On-Insulator by Wafer Bonding: A Review." Journal of the Electrochemical Society 138, no. 1 (1991): 341. Compared to known SiGe based process, FIG. 2, FIG. 3 this disclosure (a) allows higher quality SOI (lower defect count wafers), (b) OISFs, etch pits, slips, threading dislocations are suppressed, (c) lower cost, (d) fully FEOL compatible, (e) device wafer stack is stable enough to grow thermal BOX on it; thus wafer design improves—bonding interface is now spaced away from active (where transistors will be formed) cap Si layer; finally chip yield and chip electrical performance improves.

Referring to FIG. 2—in known process, SiGe does not allow growing thermal oxide on cap Si (as SiGe relaxes at oxidation temperatures). Therefore, old process uses BOX grown on handle stack. Thus, final SOI get bonding interface at undesirable location—on top of BOX. Electrical properties of final SOI thus compromised. In new process, device wafer stack has more thermally stable Si:B:F layer. Thus, BOX can be thermally grown. Oxidation temperature must be 800 C or less—to limit Boron diffusion into cap Si. Referring to FIG. 3—in known process, highly strained SiGe layer is prone to relaxation (i.e., form defects) especially near wafer edges. KLA SP2 haze maps typically show high haze (relaxed SiGe) near wafer edges. Quality of final SOI thus compromised. In new process, Si:B:F has much lower stress than SiGe. Therefore Si:B:F does not develop defects while SOI wafer is manufactured. Quality of final SOI thus improved.

As compared to Si:B based process known in the art FIG. 4, FIG. 5, thin SOI enabled for the first time. Inventive Si:B BESOI process is compared to a process described in a paper Maszara, W. P., Goetz Goetz, A. Caviglia, and J. B. McKitterick. "Bonding of silicon wafers for silicon-on-insulator." Journal of Applied Physics 64, no. 10 (1988): 4943-4950.

Referring to FIG. 4—in old process, native oxide bake-off done at high temperature>1000 C, typically 1150 C. Therefore, Boron diffuses from etch stop layer into p– layer. After outdiffusion, less than 1E20 cm–3 boron left in Si:B. It further causes low etch selectivity; process fails. In new process, Hydrogen bake replaced by low temperature oxide removal—in situ Centura-Siconi or Entrepid-Previum. Thus in inventive process neither cap Si nor Si:B suffer from Boron diffusion. Eventually thin SOI process enabled. Referring to FIG. 5—in old process, Boron concentration is limited to solid solubility. For efficient etch stop, B has to be 1E20 cm–3 or higher. It further requires temperature>1150 C. At >1150 C B diffusion prevents making thin SOI. In new process, for etch stop, B has to be electrically active. It is done by amorphization-SPE sequence at <600 C, thus B diffusion is negligible. SPE is not limited to solubility limit, thus >1E20 cm–3 easily obtained, giving high >100:1 etch selectivity.

Notice, when thin BESOI technology was in existence—from mid 80s till mid 90s, the low temperature alternative to hydrogen bake was not known yet. Now BF2/SPE/Siconi sequence being patented here—allows thin BESOI.

Final wafer has the same design—"BOX-bottom-bonding+thermal oxide BOX" as wafer made by layer transfer—Smart-Cut. Therefore, this BESOI wafer is equal in quality to layer-transfer-made one.

Fluorine content from BF2 implant: passivates traps near the gate-dielectric interface resulting in lower leakages in final chips. Low leakage is a footprint of disclosed process on final product—SOI wafer. Other footprints are—fluorine near cap Si-BOX interface, and low OISF count/high GOI yield.

DETAILED DESCRIPTION OF THE INVENTION

1$^{st}$ Preferred Embodiment

Figure 1:
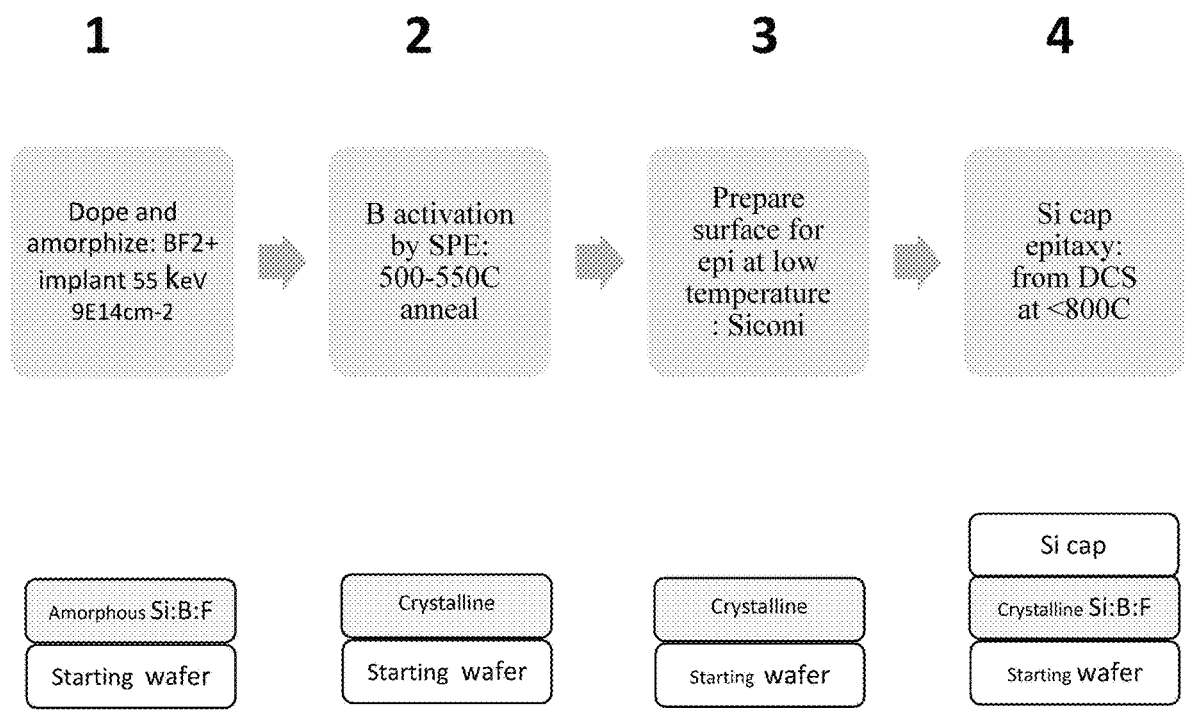
FIG. 1 illustrates a schematic process flow of BESOI process due to the invention.
Figure 2:
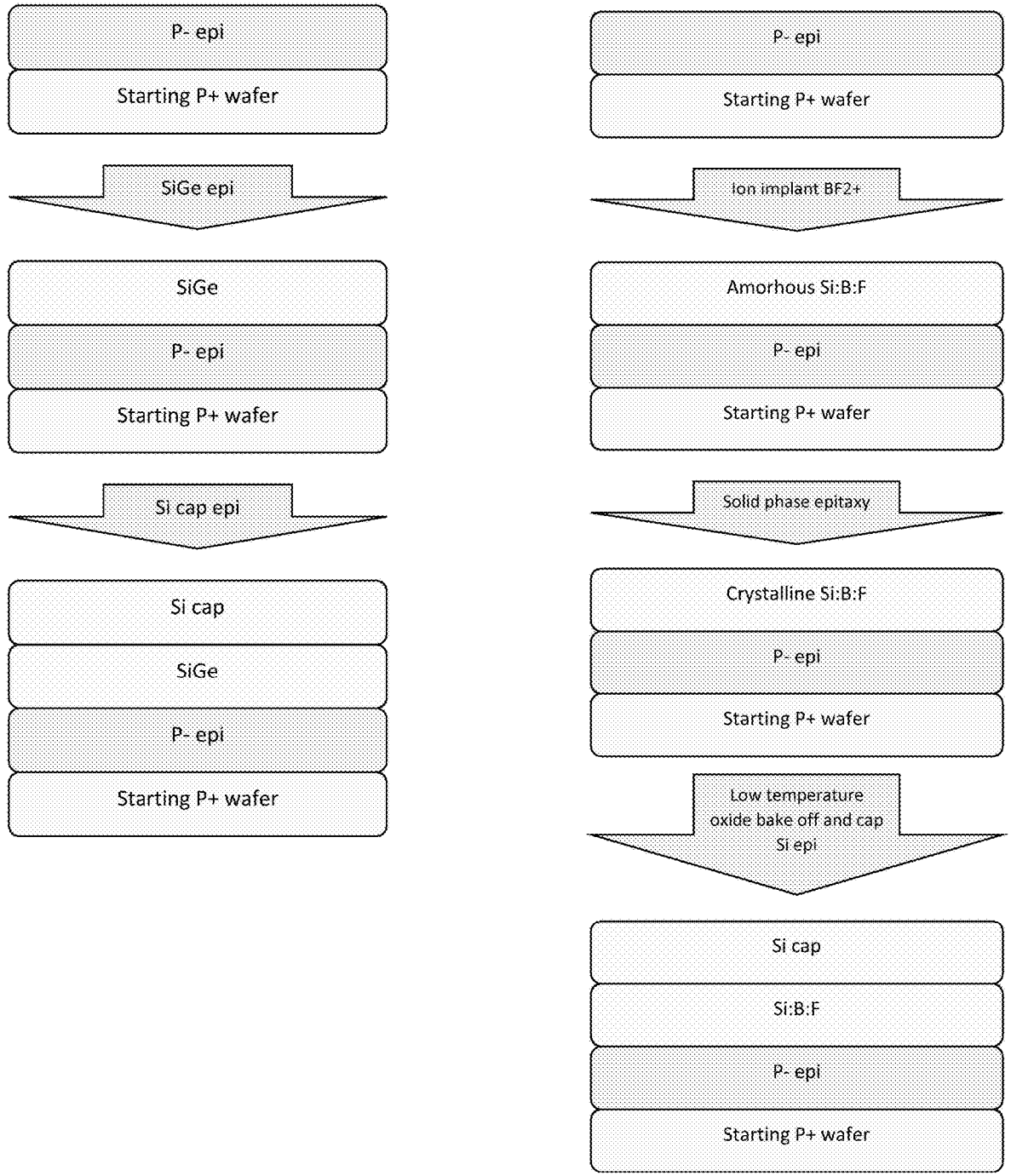
FIG. 2 compares art process with SiGe etch stop (left) to inventive process (right).
Figure 3:
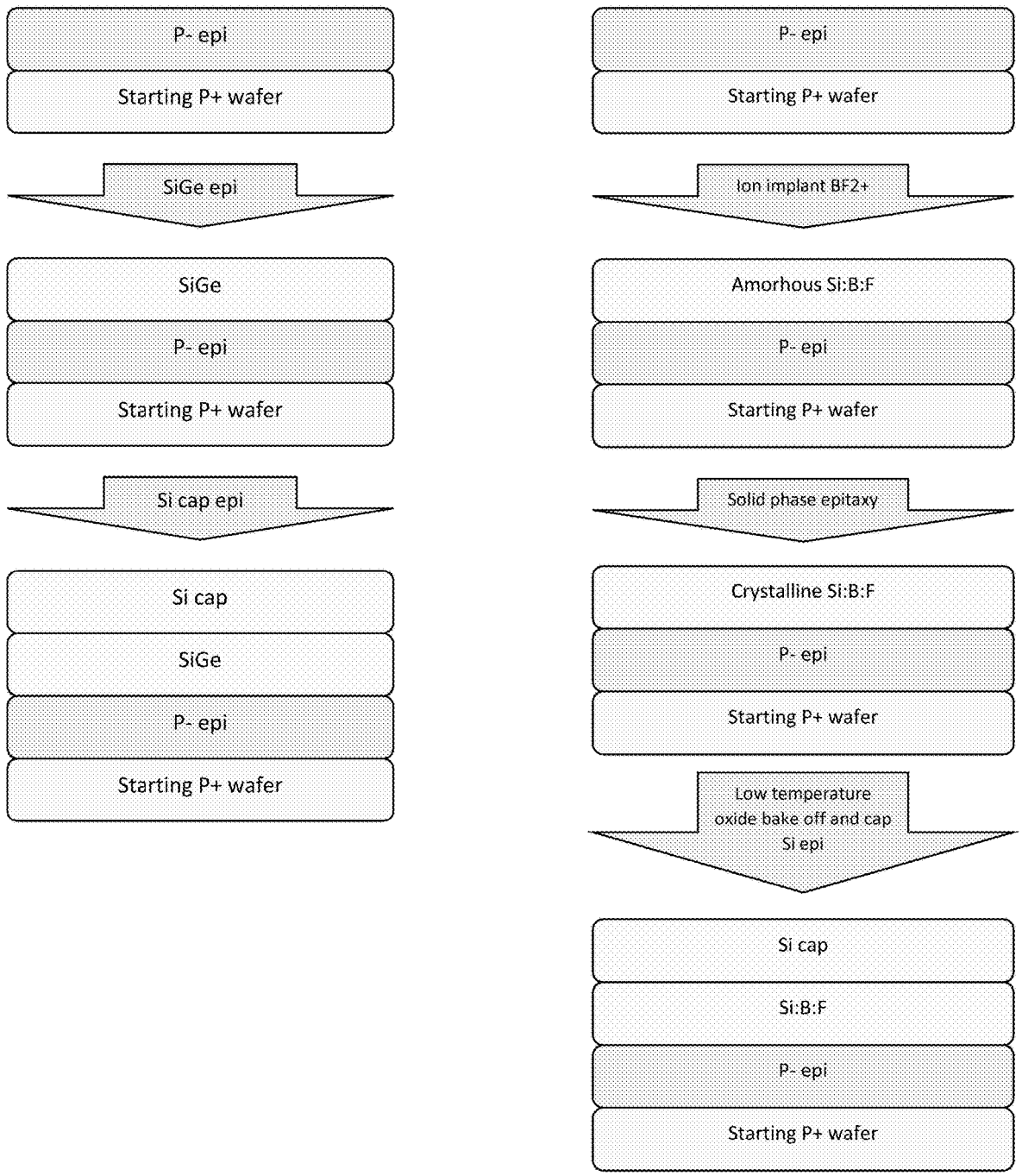
FIG. 3 further compares art process with SiGe etch stop to inventive process
Figure 4:
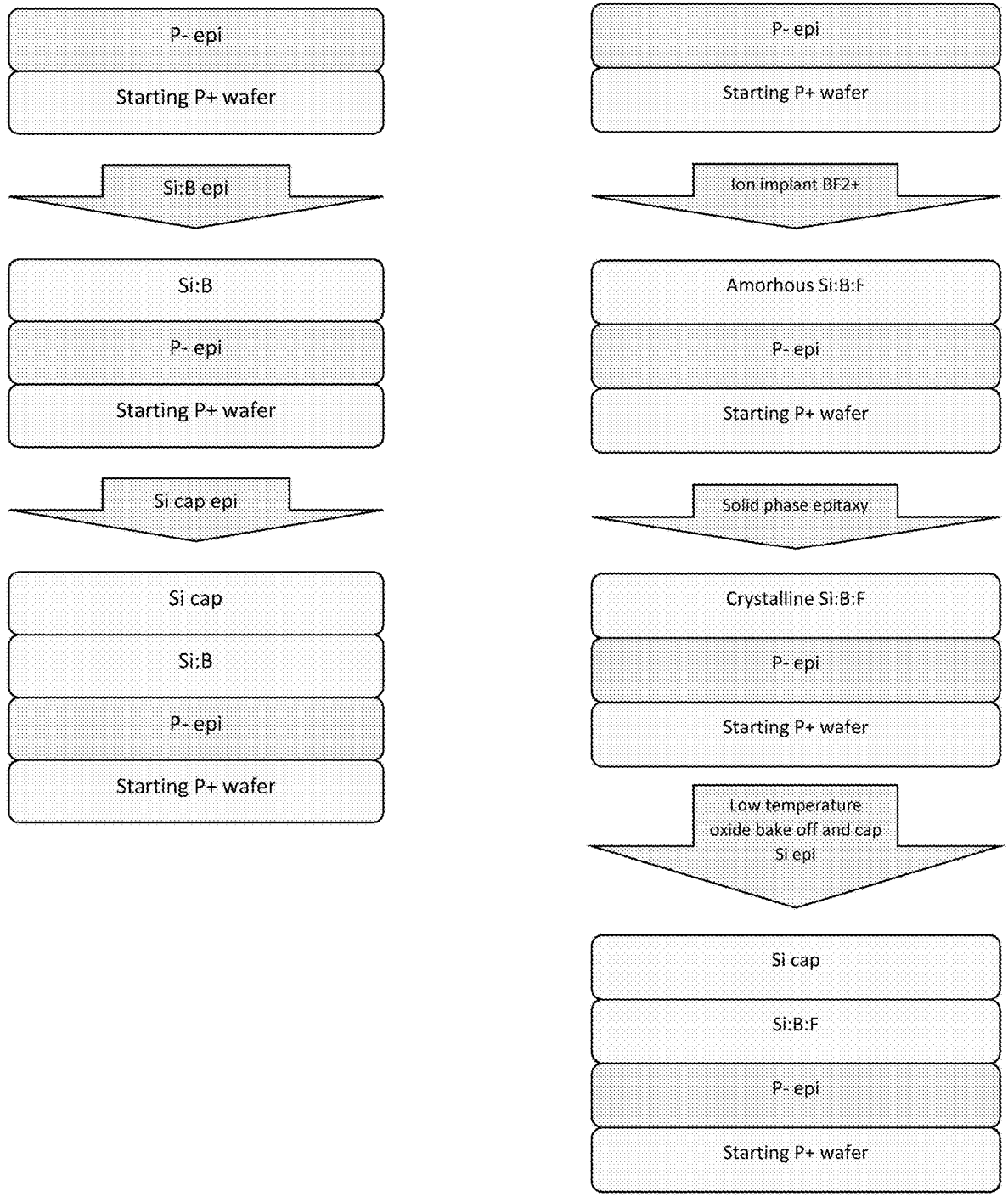
FIG. 4 compares art process with Si:B etch stop to inventive process
Figure 5:
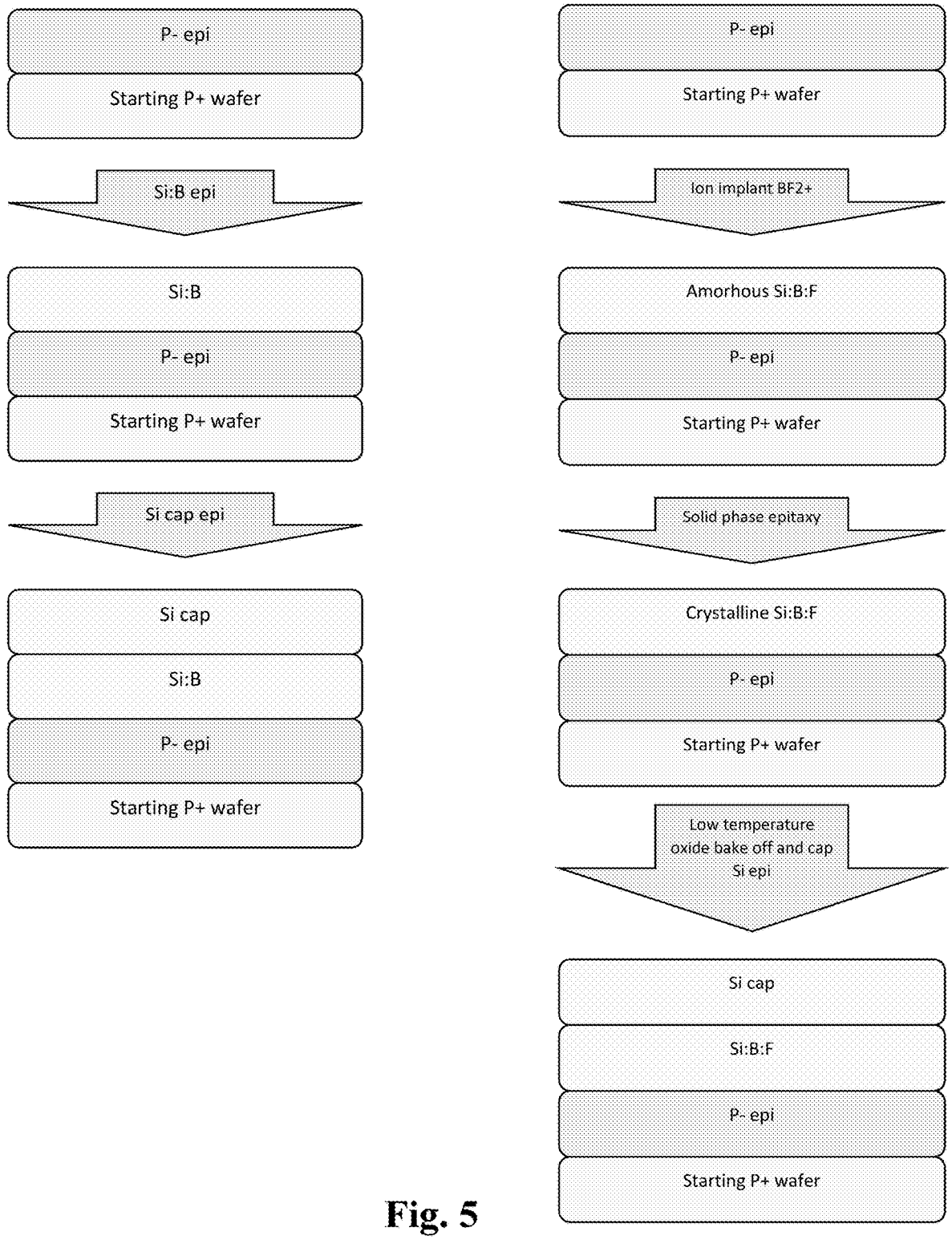
FIG. 5 further compares art process with Si:B etch stop to inventive process

First, a seed wafer is prepared. It can be called also donor wafer, or device wafer. Starting wafer is, for example an epi wafer 300 mm size having p++ bulk and 1 to 5-micron thick p− epi. Wafers with 5-micron epi are readily available from all major wafer manufacturers as they are used in mainstream CMOS chip manufacturing. The 5-micron thickness is acceptable, but not optimal for the inventive process. An optimal 1-2-micron epi can be made either on special order or grown in-house. Referring to FIG. 1, step 1, BF2+ ion implantation is performed into the p− epi. An exemplary recipe—implant at 55 keV, 9E14 cm−2—satisfies all the conditions needed: (1) it amorphizes Si from surface to about 100 nm, (2) deliver proper amount of Boron to form high selectivity etch stop, (3) deliver Fluorine—to exclude OISF formation during chip fabrication. For the BESOI process, an obvious method to prevent OISF—by lowering of metal contamination—is not applicable—as there are BEOL steps in the process—grinding of sacrificial wafer, HNA etching till 1$^{st}$ etch stop, etc. In this invention the metal contamination problem is solved by an metal gettering by layer that is heavy doped Boron and Fluorine. This provides OISF immunity.

Figure 6:
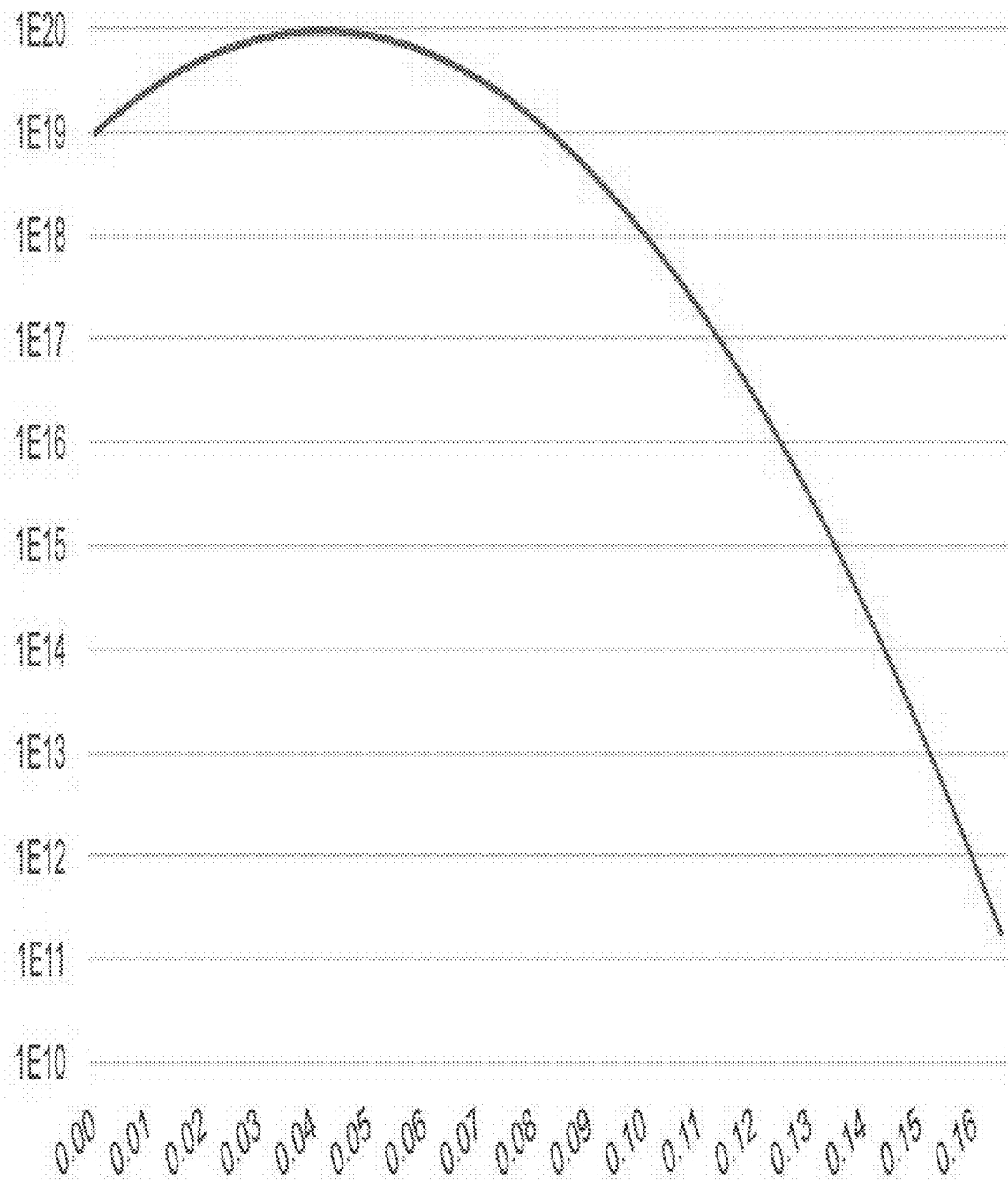
FIG. 6 shows as-implanted boron profile after exemplary implant recipe BF2+ at 55 keV, 9E14 cm−2.

An exemplary recipe 55 keV, 9E14 cm−2 can be done at medium or high current implanters available at fabs, for example AMAT (Varian) HC implanter. In this recipe Boron has energy 12.35 keV. FIG. 6 shows an as-implanted boron distribution: —concentration for etch stop->2E19 cm−3 is from 12 till 78 nm, peak concentration 9.6E19 provides high enough selectivity >100. Optionally the wafer can be oxidized—10 nm SiO2—before implant—to avoid channeling, and for easy post implant clean by oxide strip.

Energy range for BF2+ implant—10-100 keV. At lower energy much higher dose is needed to exceed amorphization threshold. At higher energy boron peak is too wide and deep thus thin SOI is more difficult to form.

Dose range for BF2+ implant—5E14-5E15 cm−2. At lower doses amorphization does not happen—thus no SPE, no B activation, no etch stop. At higher doses F and B clusters are formed, further causing defects in cap silicon.

Figure 7:
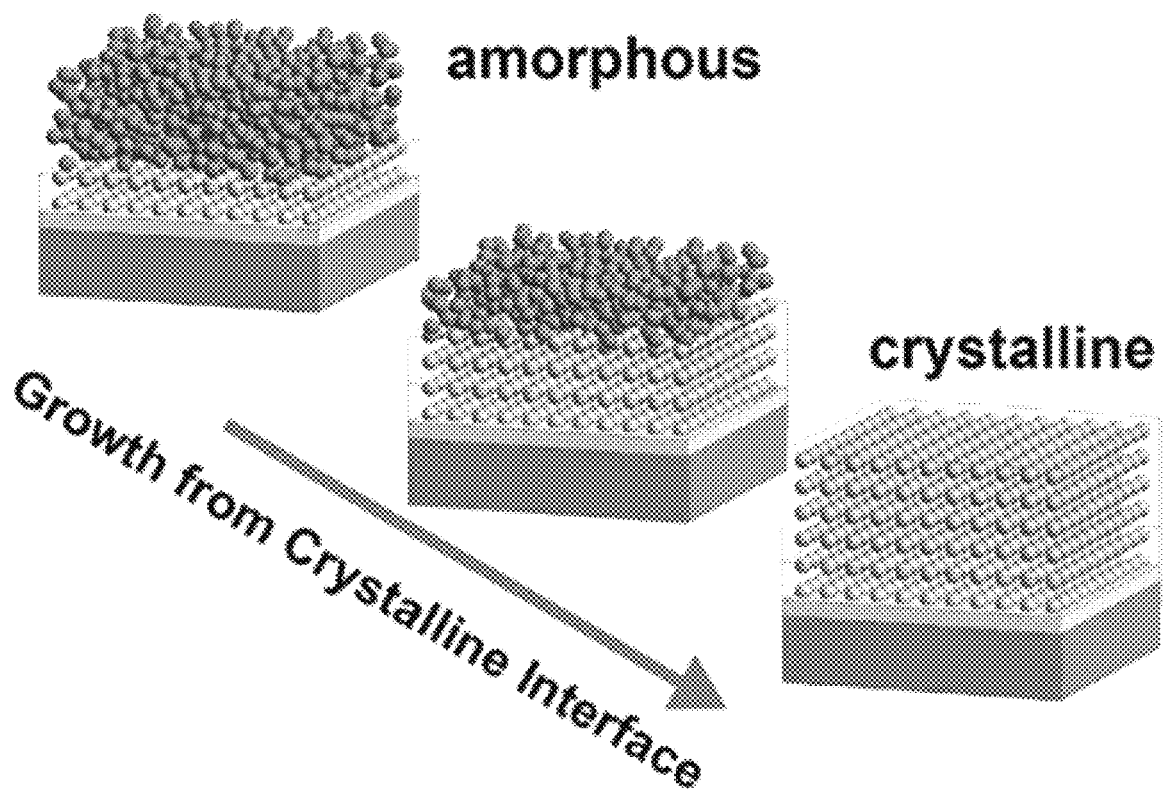
FIG. 7 illustrates concept of SPE process.

Referring to FIG. 1, step 2, solid phase epitaxy (SPE) is performed. SPE is a special mode of recrystallization of amorphous layer if it is in contact with a crystalline lattice, see FIG. 7 for illustration. Amorphous Si itself is stable till 600 C. Above 600, crystals nucleate in bulk of a-Si and grow until all becomes crystal grains (poly crystal). At temperatures 450-580 C there is no nucleation in bulk of a-Si. Amorphous Si only crystallize at a/c interface inheriting proper lattice orientation and lattice constant. The a/c interface moves till all a-Si becomes single crystal.

Surprisingly, despite almost any ion implanter has BF2+ capability, BF2+ followed by SPE is still not well studied, see Mirabella, S., G. Impellizzeri, E. Bruno, L. Romano, M. G. Grimaldi, F. Priolo, E. Napolitani, and A. Camera. "Fluorine segregation and incorporation during solid-phase epitaxy of Si." Applied Physics Letters 86, no. 12 (2005): 121905. Even though, fluorine redistribution upon SPE has bright anomalous feature—heavy segregation toward surface, still no much studies beyond University of Padova, Italy team. In this application, the fluorine segregation toward surface is very advantageous—we get (1) high F concentrations near bottom of cap Si in final SOI wafer—this gives OISF suppression as F prevents metal precipitates to evolve into OISF, (2) high F content in BOX—as BOX is grown here. —all excess of fluorine "self-removes"—leave wafer after SPE. Thus, only less than few % of as-implanted fluorine is left in silicon. Upon next anneal steps in BESOI processing, this fluorine redistributes by diffusion and eventually binds to existing defects in cap Si and Si-BOX interface thus passivating them.

So far, only one commercially viable application of BF2/SPE is known—making shallow source/drain contacts in MOSFETs—Kanemoto, Kei, Akira Nakada, and Tadahiro Ohmi. "Minimization of BF2+-Implantation Dose to Reduce the Annealing Time for Ultra-Shallow Source/Drain Junction Formation below 600° C." Japanese journal of applied physics 37, no. 3S (1998): 1166. To the best of our knowledge, it was no attempts to use BF2-then-SPE to make BESOI in the art.

The higher temperature, the higher SPE rate. We need to SPE 50-100 nm of layer amorphized by implantation in reasonable time range—10-100 minutes. 100 nm of pure Si will SPE in ~10s at 580 C and in ~10 min at 450 C. B-doped Si SPE rate is roughly 10× faster than pure. F-doped Si SPE roughly 100× slower than pure. Finally, B+F doped Si SPE roughly 10× slower than pure. Therefore, the temperature range for SPE is 450-580 C. At lower temperatures SPE is too slow. Above 580 C SPE regrown layer contains defects. Optimal temperature/time is around 550/30 min. This BF2/SPE process is somehow like making shallow source/drain extensions which also calls for amorphization/SPE to get electrically active Boron well above solubility limit.

An important feature of SPE—activation well above solubility limit—is used here. SPE is performed at low temperature<600 C, thus it is an ideal to prevent undesirable Boron diffusion. Notice, Si:B:F layer behavior was neither well studied/understood, nor used to improve BESOI process.

There were attempts in the art as to make BESOI wafer using BF2 ion implantation—see: Desmond, Cynthia A., Charles E. Hunt, and Shari N. Farrens. "The Effects of Process-Induced Defects on the Chemical Selectivity of Highly Doped Boron Etch Stops in Silicon." Journal of The Electrochemical Society 141, no. 1 (1994): 178-184. However, they used RTA (rapid thermal anneal), not SPE. Thus, no high boron activation, then no good etch selectivity, heavy boron out diffusion, and eventually low quality BESOI wafer.

Referring to FIG. 1 step 3, the wafer is loaded into epitaxy tool—to grow cap silicon film over the boron etch stop layer.

Regular epi cannot be used—it starts from hydrogen bake step at >1100 C. At this temperature boron diffuses and B concentration in ion implant peak drops. If it drops below 2E19 cm−3, the layer will not serve as an etch stop anymore. Also, above 800 C "over-solubility-limit" boron de-activates, thus does not contribute to the etch selectivity. Therefore, traditional hydrogen bake cannot be used here. Instead, low temperature process is used to prepare surface for epitaxy—i.e., remove native oxide from surface. If AMAT tool is used, the surface preparation is done in Siconi chamber—before wafer moves into epi chamber. If ASM Epsilon or Intrepid tool is used, the surface preparation is in Previum chamber. Even though Siconi and Previum are different processes, for our purposes important is only that they both capable to remove native oxide from surface at low temperature, thus enabling epitaxy.

Referring to FIG. 1, step 4, regular silicon epitaxy is performed at temperature 800 C or below. 800 C limit is for the same reasons—limit boron diffusion and prevent boron deactivation. As cap silicon is typically thinner than 100 nm, this limitation does not lower the throughput. Regular deposition from trichlororosilane takes about 100 s.

All other steps of BESOI wafer manufacturing—bonding and thinning—are the same as in a regular process known in the art, therefore these steps are not described here.

2$^{nd}$ Preferred Embodiment

This embodiment describes how to enable proximity metal gettering at final stages of SOI wafer fabrication. Thus, metal contamination from all process steps that are before the final thinning does not cause OISF and next GOI failure in the chips. For BESOI manufacturing it means that BEOL lines can be used, except 3 final process steps—boron etch-stop removal, bond finalizing, and cap silicon layer thickness adjustment.

An issue inherent to all SOI wafers regardless of manufacturing method (SIMOX, BESOI or layer transfer) is that BOX precludes metal gettering by handle wafer from cap Si. Therefore, BESOI wafers made with the processes known in the art are extremely sensitive to metal contamination. This disclosure enables gettering in BESOI thus suppressing OISFs, improve GOI and yield of final chips.

Here, the Si:B:F layer serves as the getter instead of the substrate. In Si, almost any heavy doped region has gettering activity, B+F doped is not an exception. Thus, Si:B:F serves 3 functions—template for cap Si epi, etch stop, and getter. The metal gettering is performed by annealing of SOI wafer after selective etch away of p− layer and before selective etch of Si:B:F layer. Anneal is in temperature range—350-750 C. At temperatures below 350 C gettering loses efficiency (due to lowering diffusivity of metals in Si with temperature). At temperatures above 750 C boron start diffusing into cap Si layer. One skilled in the art can choose the proper annealing temperature to achieve efficient gettering using, for example, using a textbook by Geng, Hwaiyu. Semiconductor manufacturing handbook. 2$^{nd}$ edition, 2017, chapter 3.4.2.

F in Si is also known as an efficient metal getter, thus BF2 implant maximizes gettering efficiency. The etch stop Si:B:F layer is sacrificial, thus all gettered metals are removed together with the sacrificial layer.

3$^{rd}$ Preferred Embodiment

In this embodiment an oxidation step added at the end of making the device wafer stack.

This way the design of the final wafer changes—bonding interface is at BOX bottom, not on top. And, BESOI turns the same design as layer transfer wafer. Accordingly, all advantages of this design (1) BOX—cap Si interface has automatically zero particles (2) less flakes and other bonding-related defects, (3) lower interface state density at BOX—cap Si interface=better electrical performance of final chips.

During oxidation some boron diffusion from p+ layer into cap Si will happen. Still, there is a process window where the B diffusion is acceptably low—at 750-800 C. Boron diffuses by vacancy jump mechanism. Therefore, the diffusion coefficient drops exponentially with temperature: 3E-13 at 1100 C and 5E-17 at 800 C; Lowering temperature by 300 C—from 1100 down to 800 C—results in 4 orders of magnitude drop of diffusion coefficient—see FIG. 10$a$—from Jones, Scotten W. "Diffusion in silicon." IC Knowledge LLC (2008): p. 25. Therefore, lowering temperature is extremely efficient way to control and minimize B diffusion.

Typical BOX thickness is 200 nm. At 750 C it needs 13 hours to grow, at 800 C—it needs 6 hours (reasonable), see FIG. 10, FIG. 11. Another reason to limit temperature—risk of B deactivation (remember, we have B well over solid solubility limit). The deactivation means dropping etch selectivity, which is undesirable. At 800 C and below there is no any significant deactivation. Also, the universal trend (i.e., Moore's law) in semiconductor industry is size shrinking. Thus, for next generations of SOI wafers—having thinner BOX around 20 nm, 750 C oxidation will take much shorter time.

Figure 10:
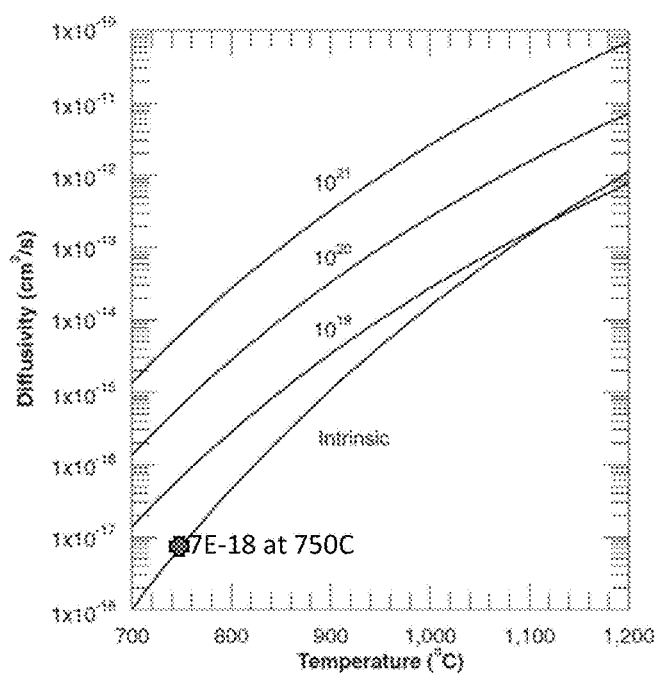
FIG. 10 illustrates boron profile widening for exemplary 750 C oxidation used to manufacture device wafer stack
Figure 10:
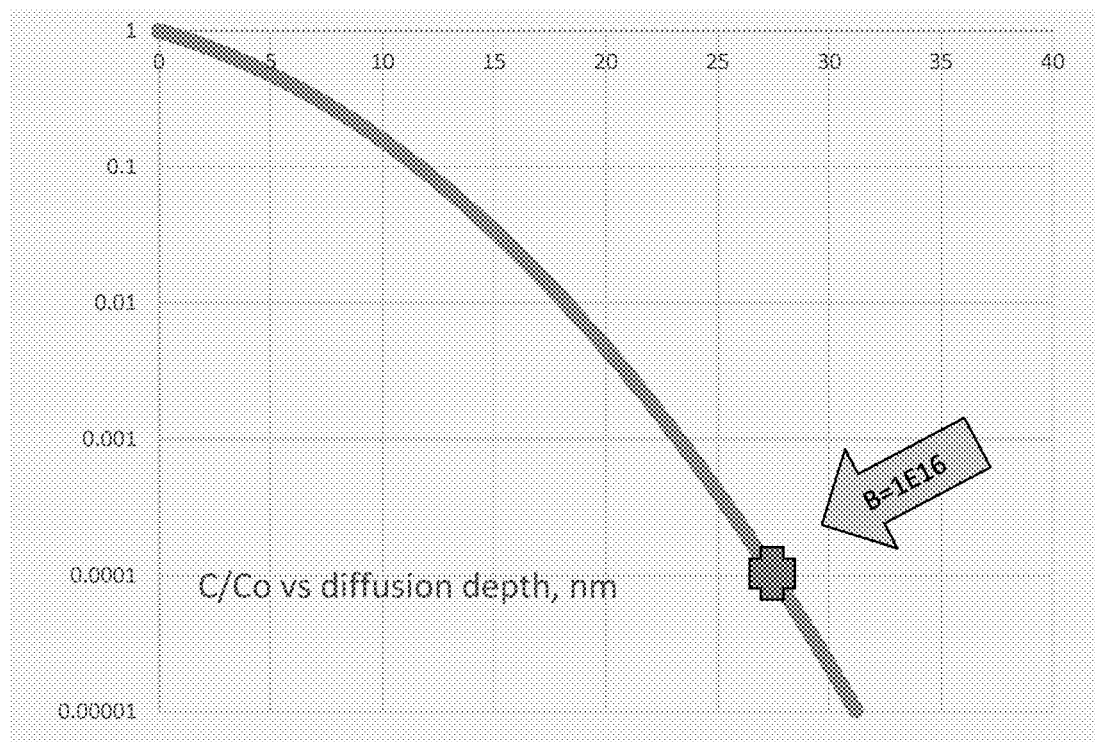

Referring to FIG. 10—an example of calculations: Oxidation temperature 750 C. To get final 80 nm cap Si SOI—add 88 nm—to be consumed by oxidation and add 28 nm to compensate B diffusion into cap Si during oxidation, add 4 nm to compensate B diffusion while epi of cap Si. Total epi needed: 80+88+28+4=200 nm.

Figure 11:
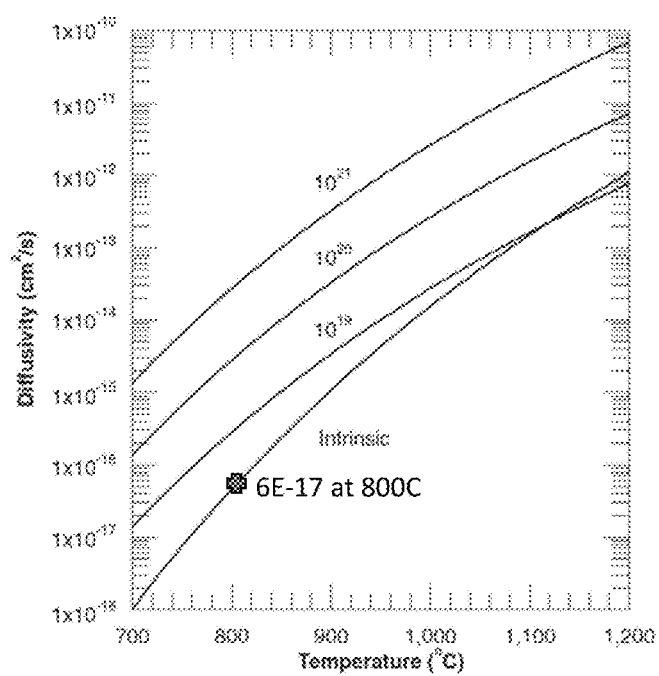
FIG. 11 illustrates boron profile widening for exemplary 800 C oxidation used to manufacture device wafer stack.
Figure 11:
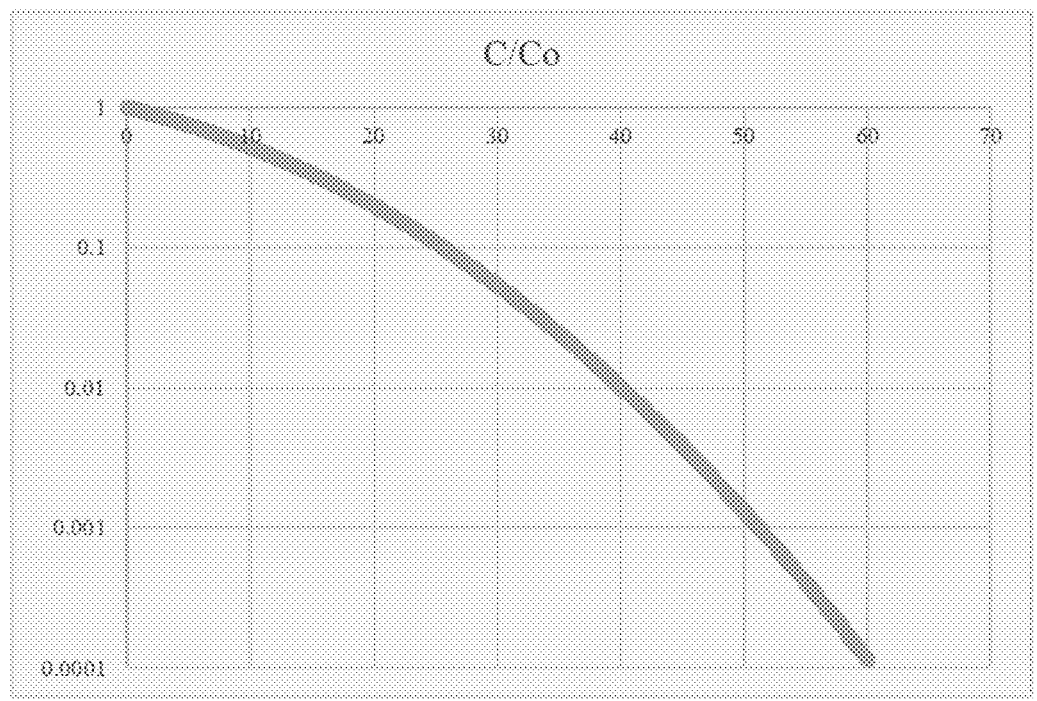

Referring to FIG. 11—if oxidation temperature is 800 C. To get final 80 nm cap Si SOI—add 88 nm—to be consumed by oxidation, add 60 nm to compensate B diffusion into cap Si during oxidation, add 4 nm to compensate B diffusion while epi of cap Si. Total epi 80+88+60+4=232 nm.

4$^{th}$ Preferred Embodiment

This embodiment is for making RF SOI. RF SOI wafer has an additional layer—polysilicon. BESOI process known in the art grow BOX from top of handle wafer stack. For RF SOI case, there is poly layer on the top of the handle stack. Thus, in known processes, BOX is made by oxidizing polysilicon. This inevitably forms very rough interface between poly and BOX.

Figure 8:
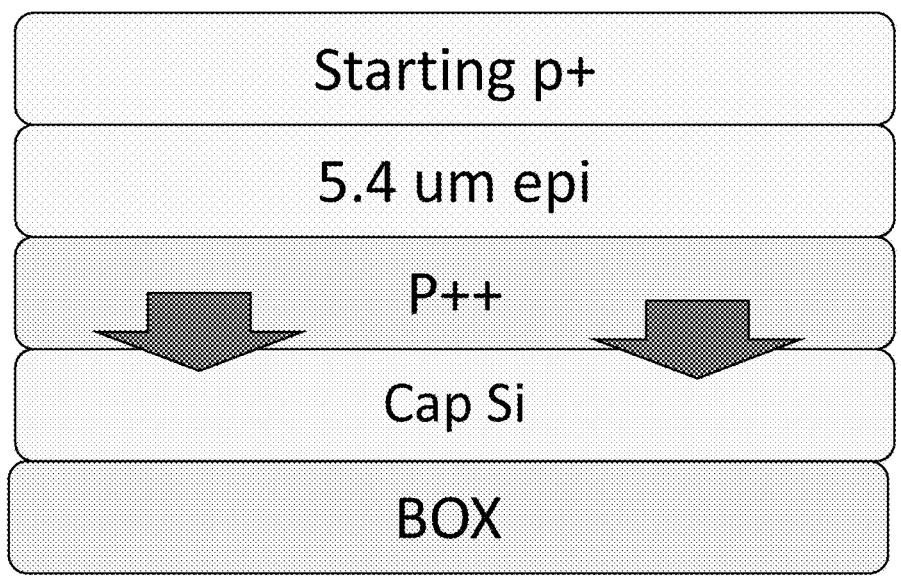
FIG. 8 schematically show device and handle wafer stacks before wafer bonding step for RF SOI.
Figure 8:
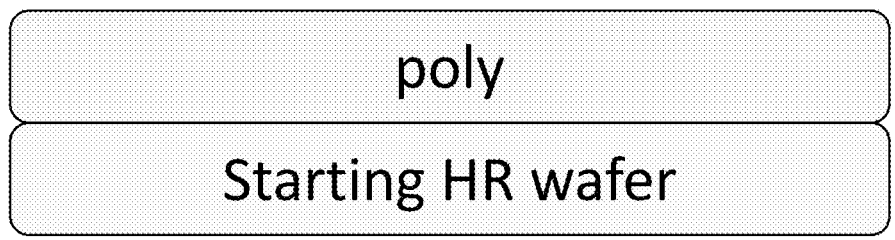
Figure 9:
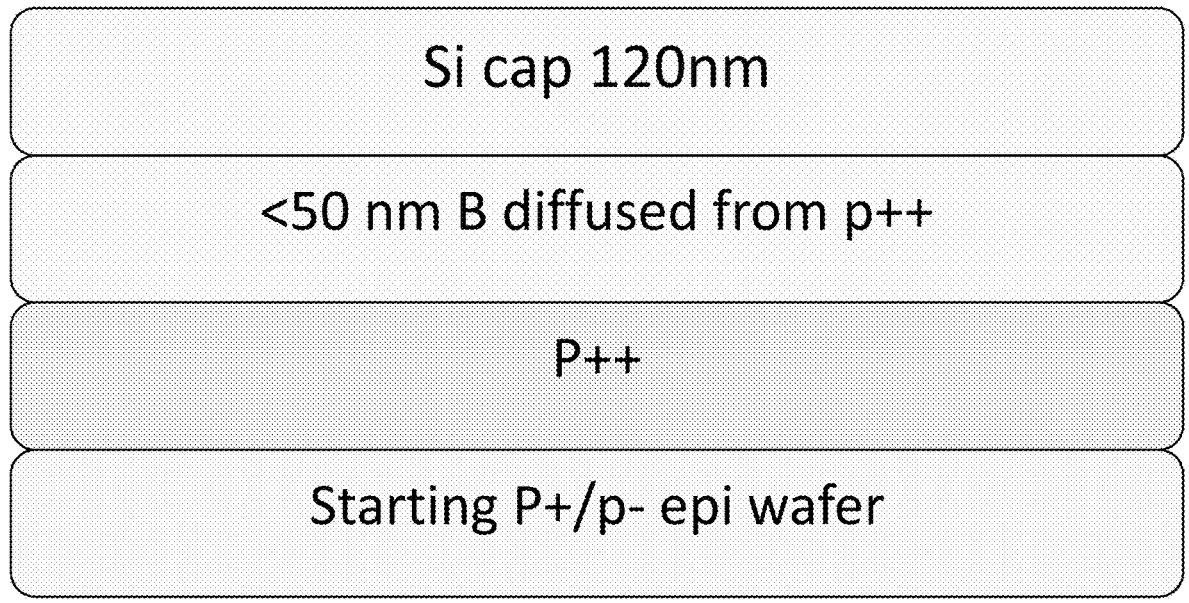
FIG. 9 schematically show a device wafer stack obtained by inventive process.

In the inventive process, BOX is grown on device wafer stack, not on handle stack. Therefore, no rough BOX/poly interface in final SOI wafer. FIG. 8 illustrates device wafer stack and handle wafer stack before bonding and thinning.

5$^{th}$ Preferred Embodiment

In this embodiment, 2 separate ion implants done instead of single BF2+ or single BF3+ implant. One is boron implant; another is fluorine implant.

Boron implant is at 5 to 20 keV—to get proper dopant location. However, boron is a light ion, thus it does not cause amorphization if implantation done at room temperature. B+ must be implanted into wafer cooled below about −50 C to achieve amorphization. End stations with cooling are available on many implanters, thus no technical challenge here.

Alternatively, F+ implant can be used for amorphization. Though F+ ion beam current is typically significantly lower than for BF2+ specie, so throughput will suffer. Advantages of separate B and F implants is that energy and dose of each specie can be independently optimized achieving high etch selectivity by Boron implant/SPE optimization, and efficient OISF suppression as well as lowering of wafer bonding temperature by F implant optimization. With separate F implant, fluorine can be implanted later, after BOX grown on device stack wafer, right before bonding. This allow F placement at future BOX/cap Si interface, thus maximizing F efficiency for suppression of OISF. This option is described in co-pending application by author.

In Silicon lattice, Boron has vacancy diffusion mechanism, while Fluorine has interstitial diffusion. Therefore, Fluorine diffusion is faster and proceeds at lower temperatures compared to Boron. To keep Fluorine from out diffusion and get maximum of its positive effects on OISF reduction, and on wafer bonding, all the following is useful (1) implant it later in the process flow, (2) use low 550 C or lower processing temperatures, (3) have oxide on surface before implant to capture F.

The invention claimed is:

1. A method for making silicon on insulator wafers comprising; preparation of device and handle wafers where said device wafer comprises a heavily doped sacrificial starting wafer covered with a stack of layers, said stack comprises etch stop layers, future cap silicon layer, and future BOX layer, said etch stop layers comprises $1^{st}$ and $2^{nd}$ etch stop layers where said $1^{st}$ etch stop layer comprises low doped silicon epi layer over said heavily doped sacrificial starting wafer, said $2^{nd}$ etch stop layer comprises heavily boron doped layer, bonding of said device wafer stack to said handle wafer, preparing bonded wafer assembly for thinning by anneal step, thinning of said device wafer stack by complete removal of said starting wafer by sequence of grinding and HNA etching, and removal of etch stop layers until said cap silicon layer is exposed characterized in that to obtain OISF free final SOI wafers, said $2^{nd}$ etch stop layer is formed by a sequence of ion implantation and solid phase epitaxy, and said ion implantation uses Boron and Fluorine containing species, and said Boron concentration in said $2^{nd}$ etch stop layer is equal or exceeds 1 E20 cm−3, and said concentration of Boron is achieved by solid phase epitaxy of layer amorphized by said ion implantation said cap silicon layer is grown over said $2^{nd}$ etch stop layer by epitaxy after surface preparation at low temperature.

2. The method of claim 1, where
said ion implantation comprises implanting $FB_2^+$ ion species.

3. The method of claim 2, where
said implantation dose is chosen to cause amorphization of silicon from surface to a depth defined by implant energy.

4. The method of claim 3, where
energy of said ions is in a range from 20 to 100 keV.

5. The method of claim 3, where
dose of said ions is in a range from $5E^{14}$ to $5E^{15}$ cm$^{-2}$.

6. The method of claim 2, where
said boron etch stop layer is formed by electrical activation of implanted boron with solid phase epitaxy.

7. The method of claim 6, where
said solid phase epitaxy is performed by <1 degree C./minute ramp up anneal starting from 450° C. till 600° C.

8. The method of claim 1, where
said cap silicon layer is grown over said $2^{nd}$ etch stop layer by epitaxy after surface preparation for epi at temperature below 600 C.

9. The method of claim 8, where
said epitaxy of the cap silicon layer is performed at temperature equal or below 800 C.

10. The method of claim 9, where
said buried oxide layer is grown from portion of said cap silicon by thermal oxidation at temperature equal or below 800° C.

11. The method of claim 1, where
gettering anneal at 350-750° C. is performed after grinding and HNA etching steps of bonded device stack and handle wafers.

* * * * *